Sept. 20, 1966 J. C. DALE ETAL 3,274,511

FREQUENCY STABILIZED SWEEP FREQUENCY GENERATOR

Filed Dec. 30, 1963

2 Sheets-Sheet 1

INVENTORS J. C. DALE
P. S. FUSS

BY

G. E. Hirsch Jr.

ATTORNEY

United States Patent Office 3,274,511
Patented Sept. 20, 1966

3,274,511

FREQUENCY STABILIZED SWEEP FREQUENCY GENERATOR

John C. Dale, Chester, and Peter S. Fuss, Randolph Township, Morris County, N.J., assignors to Bell Telephone Laboratories, Incorporated, New York, N.Y., a corporation of New York Filed Dec. 30, 1963, Ser. No. 334,655
8 Claims. (Cl. 331—10)

Figure 1:
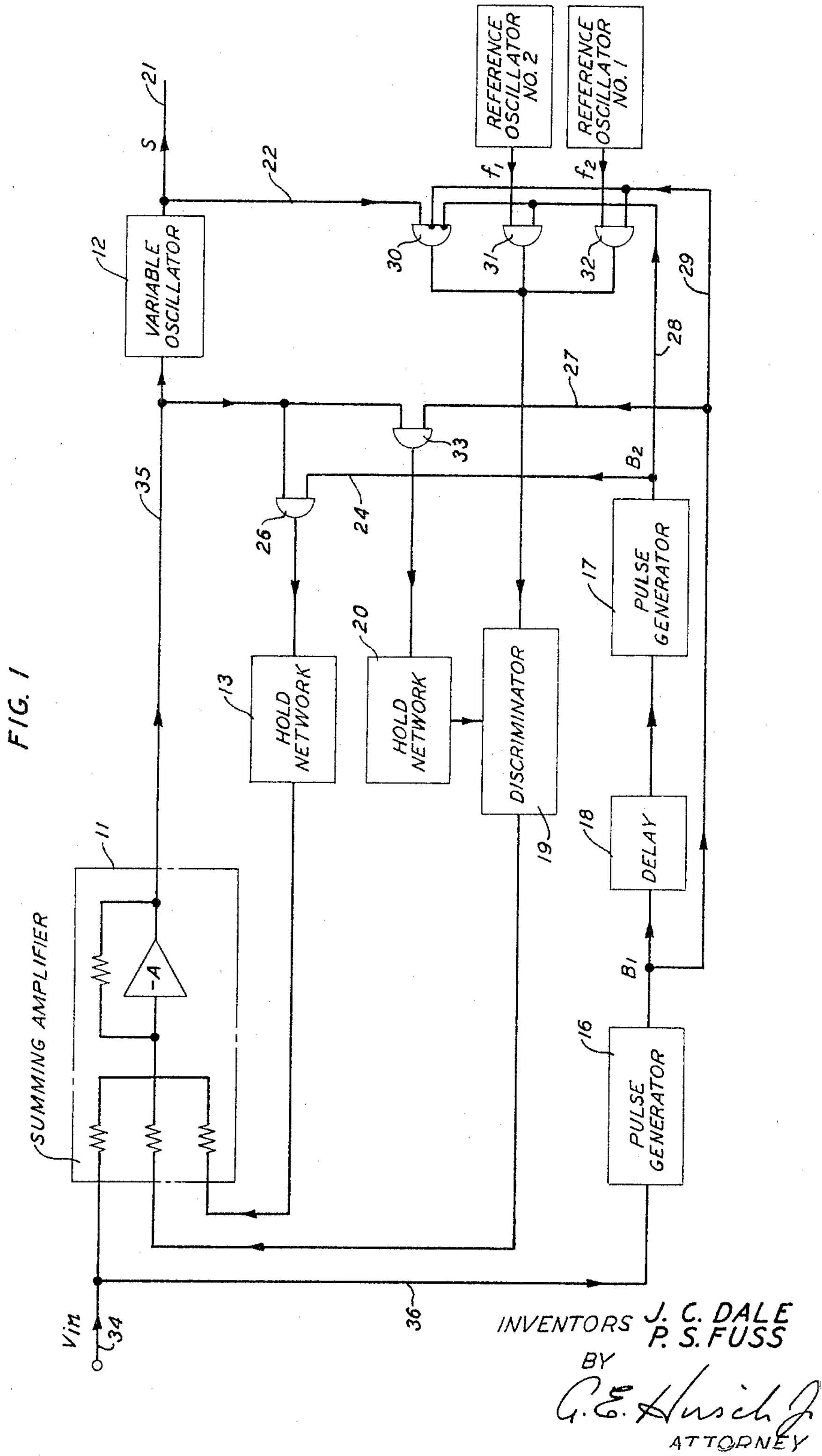

This invention pertains to the generation of signals of variable frequency and, more particularly, to improved apparatus for developing a signal of a frequency proportionate to the magnitude of an applied signal.

Signal controlled generators have found diverse uses in the field of electronics, particularly in the art of measurement. For example, spectrum analyzers require a local oscillator having a precise, linear frequency sweep. Conventional techniques for generating a sweep frequency signal have relied upon the use of mechanical rotating capacitors whose plates are shaped to generate a predetermined functional variation of frequency. With all the limitations inherent in the use of mechanical moving parts, engineers have been motivated to find a substitute.

A technique for surmounting these limitations has been the use of nonmechanical feedback systems. The transformation of an input voltage signal, whose amplitude is a function of time, into an output signal whose frequency, correspondingly, varies as the same function of time is typically accomplished by utilizing a feedback loop incorporating a variable oscillator, a frequency discriminator, and a summing amplifier. The variable oscillator, in response to a control signal developed by the summing amplifier, generates a signal of variable frequency. A signal, of a voltage proportionate to the signal frequency, is developed by the discriminator, and is jointly applied with the variable amplitude input signal to the summing amplifier. The resultant control signal, in a well-known fashion, forces the oscillator to generate a signal having a frequency variation similar to the amplitude variation of the input signal. Such systems, however, are entirely dependent on the stability of the input signal, the invariance of the input-output characteristic of the discriminator and any D.C. shift at the input to the summing amplifier. It is well known, however, that fluctuations in environmental conditions such as temperature, humidity, shock and vibration will severely affect the stability of a signal controlled generator dependent on these parameters.

It is the principal object of this invention to improve the stability of a signal controlled generator.

Another object of this invention is to improve a signal controlled generator by assuring that it is insensitive to drift errors appearing at its input.

Another object is to reduce the sensitivity of a signal controlled generator to drift errors which arise in associated apparatus, such as a frequency discriminator.

Yet another object is to improve a signal controlled generator by rendering it insensitive to variations in the slope of the input-output characteristic of apparatus, such as a frequency discriminator, used as a component part of the generator.

These objects are accomplished, in accordance with the present invention, by utilizing correcting circuitry in conjunction with a feedback loop incorporating a variable oscillator, a frequency discriminator and a summing amplifier, to generate a signal having a frequency directly proportionate to the magnitude of an input sweep voltage signal. The correcting circuitry compensates for errors which result from, among other causes, D.C. level changes at the input of the generator and the output of the discriminator, and variations in the slope of the input-output characteristic of the discriminator. Compensation is effected by periodically substituting reference signals of precise and known characteristics for those developed by the feedback loop, sampling the resultant error signals, storing these error signals, and applying them as countervailing signals during the succeeding sweeps of the input signal.

Thus, according to the invention, two sampling pulses, displaced in time, are generated at the termination of each sweep of the input signal, and used to remove the output coupling to the feedback loop, and to momentarily substitute the signals of two diverse reference oscillators. Two error signals, one proportionate to the alterations in the slope of the discriminator characteristic and the other to D.C. level changes in the input signal, and summing amplifier, and discriminator, are sampled and applied to hold networks, used for storing the signals. One hold network presents an error voltage to the input of the apparatus during the next succeeding sweep, thus to compensate for any D.C. drift in the input signal, summing amplifier, or discriminator and to ensure sweep-to-sweep stability of the initial signal frequency. The other hold network is used to compensate for any deviations in the slope of the input-output characteristic of the discriminator.

By the practice of this invention, sweep-to-sweep and long time stability is ensured. The variation of the output signal frequency is inexorably determined by the input signal. Compensation for the drift error in the input signal, summing amplifier, and discriminator establishes an invariant initial signal frequency. Moreover, the frequency discriminator in conjunction with the feedback loop necessitates a linear functional relationship between the input and output signals. Also, compensation for deviations in the discriminator characteristic establishes an invariant final signal frequency. Thus, with this linear relationship, and the stabilization of the initial and final frequences, stability is mathematically ensured.

These and further features and objects of this invention, its nature and various advantages, will be readily apparent upon consideration of the attached drawings and of the following detailed description of the drawings.

Figure 2:
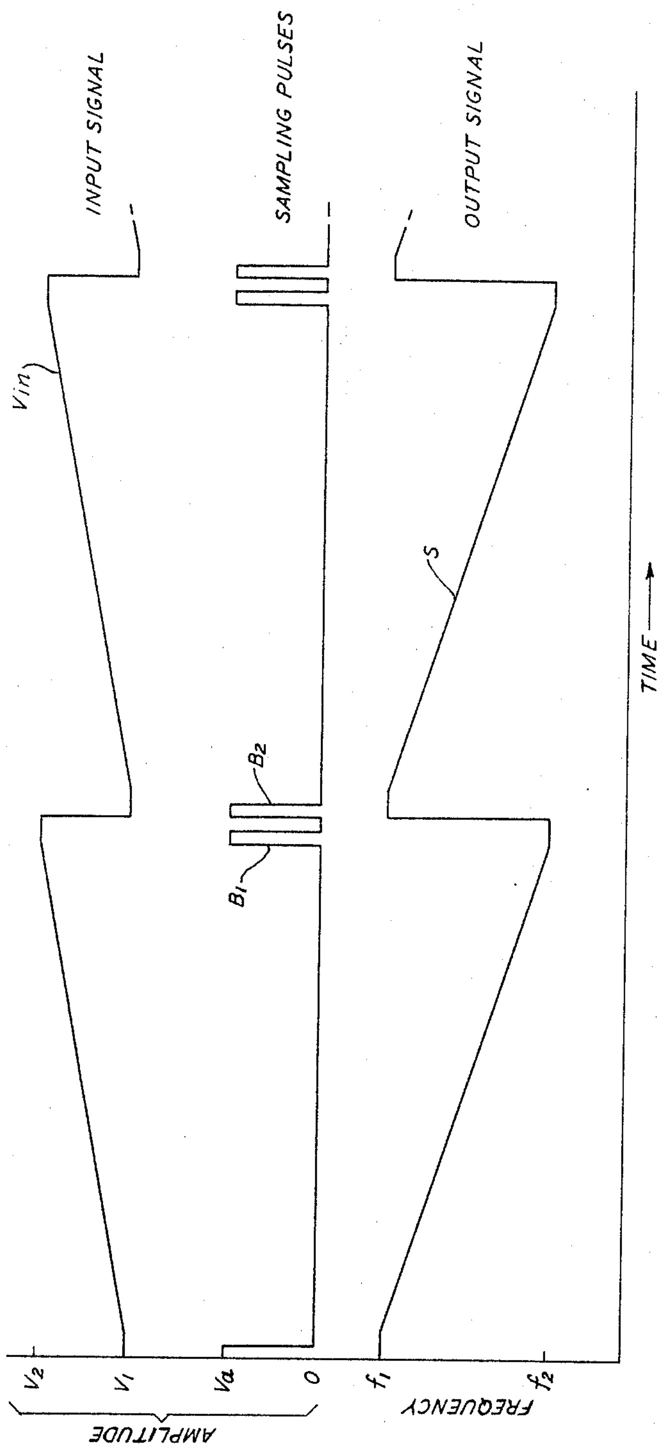

In the drawings:

FIG. 1 is a schematic block diagram illustrating a preferred embodiment of the invention; and FIG. 2 is a composite set of waveforms of various signals occurring during typical operation of the embodiment of FIG. 1.

The embodiment of the invention illustrated in FIG. 1 generates a signal having a linear frequency variation, in time, shown as waveform S (FIG. 2), in response to an input voltage signal, depicted by waveform $V_{in}$ of FIG. 2, whose magnitude varies as a function of time. Before turning to the details of the illustrative apparatus of FIG. 1, however, it is believed helpful to discuss, generally, certain essential operations of the invention.

Briefly, a variable oscillator is used to generate an output signal having a frequency related to the magnitude of an applied control signal. Since the relationship of output signal to control signal is not linear, the output signal S, of variable frequency, is coupled to a frequency discriminator which develops a signal voltage, linearly proportionate to the frequency of the output signal, which is jointly applied with the input signal to a summing amplifier. The variable oscillator, responsive to the control signals of the summing amplifier, is therefore forced to track the input signal in a linear manner. Though linearity is attained, the resultant generator will be sensitive to drift variations in the input signal, summing amplifier, and discriminator output in addition to alterations in the discriminator characteristic. By the practice of this invention, however, this sensitivity is eliminated.

Thus, periodically, at the termination of the input sweep signal, a sampling pulse is generated for activating a gate network which substitutes a reference oscillator of frequency $f_2$, corresponding to the desired terminating frequency of the output signal, for the output signal-discriminator coupling. If the input-output characteristic of the discriminator has suffered an alteration in slope, an error signal appears at the output of the summing amplifier proportionate to this deviation. Simultaneous with the above gating operation, the error signal is gated to a hold network which alters the characteristic during the entire period of the next succeeding sweep, thus to compensate for the deviation.

At a short interval of time following this operation, a second sampling pulse is generated which decouples the output signal S from the discriminator and substitutes a second reference oscillator of frequency $f_1$, corresponding to the initial frequency of the output signal. A variation in the D.C. level of the input signal, summing amplifier, or discriminator signal will appear as a drift error signal at the output of the summing amplifier. This signal is applied via gating means to a second hold network which during the next succeeding sweep, presents a compensating voltage at the input of the summing amplifier.

Thus by the practice of this invention, sweep-to-sweep stability is ensured regardless of variations in the D.C. level of the input, summing amplifier, or discriminator signals and alterations in the slope of the discriminator characteristic.

Turning now to a consideration of the apparatus of FIG. 1, an input sweep voltage signal, from any convenient source (not shown), is applied at line 34 to summing amplifier 11. Variable oscillator 12 of any desired construction, responsive to the control signal appearing at the output of amplifier 11 on line 35 generates a signal S having a frequency $f$ related to the magnitude of the control signal. Signal S is supplied via line 21 to a utilization device (not shown) of any desired sort, and also is applied via line 22 and transmission gate 30 to frequency discriminator 19. Discriminator 19 may be a "pulse count discriminator," well known in the art, which develops a voltage linearly related to the frequency of an applied signal by generating a constant area pulse for every positive going zero crossing of an applied sine wave and integrating these pulses. The output of the discriminator is applied to a second input of summing amplifier 11. In a well-known fashion, a control signal is developed, minimizing any difference between the input and discriminator signals. Thus, the output signal frequency $f$ will follow all variations of the input signal.

Upon the input signal $V_{in}$ attaining voltage $V_2$ (FIG. 2), pulse generator 16 is energized via line 36 and generates a pulse, $B_1$ of FIG. 2, which inhibits transmission gate 30, via line 29, and activates transmission gates 33 and 32 via lines 27 and 29, respectively. Thus the output signal S is decoupled from the discriminator. In place of the usual drive afforded by signal S, reference oscillator No. 1, of frequency $f_2$ corresponding to the specified terminating frequency of the output signal frequency, is gated to the input of discriminator 19. The discriminator, accordingly, develops a voltage proportionate to this frequency. If the slope of the discriminator characteristic has been altered, due to changes in the thermal environment, etc., the voltage developed by it will differ from $V_2$, the terminating voltage of $V_{in}$. Accordingly, by the practice of this invention, summing amplifier 11 develops an error voltage at line 35, proportionate to this difference and thus to the deviation in the slope of the characteristic. This error voltage is applied by gate 33, to hold network 20, an energy storing network, which retains the voltage for the next succeeding sweep. Hold network 20 applies this voltage to discriminator 19, to effect a change in the amplitude or pulse width of the pulses generated by the discriminator. The area of the pulses is therefore changed, affecting the cumulative integrated signal, and consequently, the slope of the discriminator characteristic is altered to compensate for the detected deviation. Hold network 20 continuously applies the compensating voltage to the discriminator 19, during the next succeeding sweep, after the circuit is returned to its original state upon the extinction of the relatively short sampling pulse.

At a short interval of time, provided by delay network 18, following the first sampling pulse, a second sampling pulse, $B_2$ of FIG. 2, is generated by pulse generator 17. This second pulse inhibits transmission gate 30 via line 28 and activates transmission gates 31 and 26 by lines 28 and 24, respectively. The output signal S is thus again removed as an input to discriminator 19 and in its place a signal of frequency $f_1$, from reference oscillator No. 2, is substituted. The second sampling pulse is timed to occur when the input signal $V_{in}$ decreases to its initial value, $V_1$ (FIG. 2), which corresponds to a frequency of $f_1$. If, however, the input, summing amplifier or discriminator has suffered a change in D.C. level, the output of the discriminator and the input voltage will not agree. Hence, an error signal proportionate to the D.C. drift, is developed by summing amplifier 11. The error signal is applied by gate 26 to hold network 13. When the sampling pulse disappears, hold network 13 continues to apply the developed error voltage to the input of the summing amplifier, thus to compensate for the D.C. drift during the next succeeding sweep.

The sampling and hold procedure of this invention is repeated periodically to provide a relatively continuous compensation for D.C. drift errors in the input signal, summing amplifier, and frequency discriminator. This is in addition to compensation for deviations in the slope of the discriminator input-output characteristic.

It is to be understood that the embodiments shown and described herein are illustrative and that further modifications of this invention may be implemented by those skilled in the art without departing from the scope and spirit of the invention. For example, the pulse generators used in this invention may be incorporated in a central control unit which provides a timing base for the input signal and the sampling pulses. The desired frequency range may be extended, beyond the limitations of conventional discriminators, by introducing a frequency divider in the feedback loop. Also, this invention is not limited to linear functions but may be used to transform any well-behaved input voltage function.

What is claimed is:

1. A stabilized sweep frequency generator responsive to an applied input signal comprising, in combination:

a variable oscillator for generating an output signal having a frequency which varies as a function of the magnitude of a control signal applied to its input, means including a frequency discriminator for developing a first signal proportionate to the frequency of an applied signal, a first reference oscillator of first specified fixed frequency, a second reference oscillator of second specified fixed frequency, means for applying said output signal to said discriminator and periodically substituting signals from said first and said second reference oscillators according to a prescribed schedule, means for developing in accordance with said schedule an error signal proportionate to the drift in magnitude of an algebraic summation of said input signal, said control signal and said first signal from the magnitude of a signal developed by said discriminator in response to signals from said second oscillator, means responsive to signals from said first oscillator, for developing in accordance with said schedule a second signal proportionate to the deviation of the magnitude of said first signal from a prescribed value, means responsive to said second signal for altering the input-output characteristic of said discriminator, and summing means responsive to said input, said first and said error signal for developing said control signal.

2. A stabilized signal generator responsive to an applied input signal comprising:

means for generating an output signal having a frequency which varies as a function of the magnitude of a control signal applied to its input, discriminator means for developing a first signal proportionate to the frequency of an applied signal, a reference oscillator, means for applying said output signal to said discriminator means and periodically substituting a signal from said reference oscillator, means for developing simultaneously with the substitution of a reference signal from said oscillator, an error signal separate and distinct from said first signal proportionate to the drift in magnitude of an algebraic summation of said input signal, said control signal and said first signal from the magnitude of a signal developed by said discriminator means, and summing means responsive to said input, said first and said error signal for developing said control signal.

3. A stabilized sweep frequency generator responsive to an applied input signal comprising:

means for generating an output signal having a frequency which varies as a function of the magnitude of a control signal applied to its input, discriminator means for developing a first signal proportionate to the frequency of an applied signal, a reference oscillator, means for applying said output signal to said discriminator means and periodically substituting a signal from said reference oscillator, means for developing simultaneously with the substitution of a reference signal from said oscillator a second signal proportionate to the deviation of said first signal from a prescribed value, means responsive to said second signal for altering the input-output characteristic of said discriminator means, and summing means responsive to said input and said first signal for developing said control signal.

4. An improved signal generator responsive to an applied input signal comprising, in combination:

means for generating an alternating output signal having a frequency which varies as the magnitude of a control signal applied to its input, discriminator means for developing a first signal proportionate to the frequency of an applied signal, oscillator means, selective means for applying said output signal to said discriminator and, upon activation, substituting a signal from said oscillator means, error means for developing, upon activation, an error signal separate and distinct from said first signal representative of the deviation in magnitude of the algebraic summation of said input signal, said first signal and said control signal from the magnitude of a signal established by said discriminator means in response to said oscillator means, means for periodically activating said selective means and upon the substitution of said signal from said oscillator means activating said error means, and means responsive jointly to said first signal, said error signal, and said input signal for developing said control signal.

5. A signal generator responsive to an applied input signal comprising, in combination:

first means for generating an alternating output signal having a frequency which varies as the magnitude of a control signal applied to its input, second means for developing a first signal proportionate to the frequency of an applied signal, oscillator means, selective means for applying said output signal to said second means and, upon activation, substituting a signal from said oscillator means, third means for applying, upon activation, a signal proportionate to the difference between the magnitude of said first signal and a predetermined specified level to said second means to compensate for said difference, fourth means for periodically activating said selective means and upon the substitution of said signal from said oscillator means activating said third means, and means responsive jointly to said first signal and said input signal for developing said control signal.

6. A sweep frequency signal generating system for cyclically generating a sweep signal of a frequency proportionate to the magnitude of an applied input signal comprising, in combination:

first means responsive to an applied control signal for generating a variable frequency output signal, second means for developing a first signal proportionate to the frequency of an applied signal, third means for generating a signal of first fixed frequency, fourth means for generating a signal of second fixed frequency, fifth means for applying said output signal to said second means, sixth means for periodically discontinuing the application of said output signal to said second means and sequentially applying signals generated by said third and said fourth means, seventh means for developing an error signal representative of the deviation of an algebraic summation of said input signal, said first signal and said control signal from a prescribed norm simultaneously with the application of a signal from said third means to said second means, eighth means for developing a second signal representative of the deviation of said first signal from a prescribed norm simultaneously with the application of a signal from said fourth means to said second means, ninth means responsive to said second signal for altering the input-output characteristic of said second means, and tenth means responsive to said input, said first and said error signal for developing said control signal.

7. A sweep frequency signal generating system for cyclically generating a sweep signal of a frequency proportionate to the magnitude of an input signal applied thereto comprising:

first means responsive to an applied control signal for generating a variable frequency output signal, second means for developing a first signal proportionate to the frequency of an applied signal, third means for generating a signal of fixed frequency, fourth means for applying said output signal to said second means, fifth means for periodically discontinuing the application of said output signal to said second means and sequentially applying a signal generated by said third means, sixth means for developing an error signal representative of the deviation of an algebraic summation of said input signal, said first signal and said control signal from a prescribed norm simultaneously with the application of a signal from said third means to said second means, and seventh means responsive to said input, said first and said error signal for developing said control signal.

8. A stabilized sweep frequency signal generating system for cyclically generating a sweep signal of a frequency proportionate to the magnitude of an applied input signal comprising:

first means responsive to an applied control signal for generating a variable frequency output signal, second means for developing a first signal proportionate to the frequency of an applied signal, third means for generating a signal of fixed frequency, fourth means for applying said output signal to second means, fifth means for periodically discontinuing the application of said output signal to said second means and sequentially applying a signal generated by said third means, sixth means for developing an error signal representative of the deviation of said first signal from a prescribed norm simultaneously with the application of a signal from said third means to said second means, seventh means responsive to said error signal for altering the input-output characteristic of said second means, and eighth means responsive to said input and said first signal for developing said control signals.

References Cited by the Examiner

UNITED STATES PATENTS

| | | | |
|---|---|---|---|
| 2,773,191 | 12/1956 | Watkins | 331—14 X |
| 3,191,129 | 6/1965 | Feldman | 331—14 X |

ROY LAKE, *Primary Examiner.*

S. H. GRIMM, *Assistant Examiner.*